(12) United States Patent
Polnyl et al.

(10) Patent No.: US 7,578,675 B2
(45) Date of Patent: Aug. 25, 2009

(54) ELECTRICAL CONTACT USED IN ELECTRICAL CONNECTOR

(75) Inventors: Igor Polnyl, Aurora, IL (US); David Gregory Howell, Gilbert, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/001,575

(22) Filed: Dec. 12, 2007

(65) Prior Publication Data

US 2009/0156021 A1    Jun. 18, 2009

(51) Int. Cl.
  *H01R 12/00*    (2006.01)
(52) U.S. Cl. .......................................... 439/66; 439/862
(58) Field of Classification Search ................... 439/66, 439/862

See application file for complete search history.

(56) References Cited

U.S. PATENT DOCUMENTS

| | | | |
|---|---|---|---|
| 5,152,695 A * | 10/1992 | Grabbe et al. | 439/71 |
| 6,193,523 B1 * | 2/2001 | Harper, Jr. | 439/66 |
| 6,227,917 B1 * | 5/2001 | Chou | 439/862 |
| 6,695,624 B1 | 2/2004 | Szu | |
| 6,932,619 B2 * | 8/2005 | Chen | 439/66 |
| 2005/0181683 A1 * | 8/2005 | Miyamoto | 439/862 |
| 2006/0105609 A1 | 5/2006 | Huang et al. | |
| 2006/0166522 A1 * | 7/2006 | Brodsky et al. | 439/66 |

* cited by examiner

*Primary Examiner*—Gary F. Paumen
(74) *Attorney, Agent, or Firm*—Wei Te Chung

(57) ABSTRACT

An electrical connector includes an insulative housing defining a number of passageways and a plurality of electrical contacts received in corresponding passageways of the insulative housing. Each contact is formed with a base portion, a solder portion bended from a bottom edge of the base portion, a spring portion and a connecting portion linking the base portion and the spring portion. The spring portion has a tip portion at a top end thereof, which is twisted and protrudes out of the insulative housing.

9 Claims, 5 Drawing Sheets

ELECTRICAL CONTACT USED IN ELECTRICAL CONNECTOR

BACKGROUND OF THE INVENTION

1. Field of the Invention

The present invention relates to contacts, and particularly to high elasticity contacts used in electrical connectors for connecting an electronic package, such as a central processing unit (CPU), with a circuit substrate, such as a print circuit board (PCB).

2. Description of the Prior Art

Electrical connectors are widely used for connecting a land grid array (LGA) package with a PCB. A typical electrical connector disclosed in U.S. Pat. No. 6,695,624 comprises a base 4 and a number of contacts 1. The base 4 defines a plurality of passageways 41 aligned in a matrix for receiving the contacts 1. The contact 1 comprises an engaging portion 11 for engaging with the passageway 41, a medial portion 13 extending upwardly from the engaging portion 11, an inclined portion 14 extending from the media portion 13, a cantilever 15 linking with the inclined portion 14 and a horizontal solder portion 11 on a bottom side of the engaging portion 11. The cantilever 15 has a contact portion 17 on an upper end thereof to contact with a package pad of the land grid array (LGA) package. However, the contact portion 17 is easily bended by cloth thread or other foreign materials from operator glove. An improved contact 2' is disclosed in U.S. Patent Application Publication No. 2006/0105609, the contact 2' is bent on a top thereof to form a curvature contact portion to prevent the contact 2' from bending by outside forces, simultaneously a width of the contact tip is increased to add robustness, that will cause a problem that a distance between adjacent contacts 2' in a same row become smaller, and short circuit possibly occurs.

Accordingly, a new electrical contact that solves the above problems is desirable.

SUMMARY OF THE INVENTION

Accordingly, an object of the present invention is to provide an electrical contact used in an electrical connector which can prevent short circuit.

To fulfill the above object, an electrical connector comprises an insulative housing having a plurality of passageways and a plurality of electrical contacts received in corresponding passageways of the insulative housing. Each contact is formed with a base portion, a solder portion bended from the base portion and a spring portion, the spring portion having a tip portion which is twisted and protrudes out of the insulative housing.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Reference is now made to the drawings to describe the invention in detail.

Figure 1:
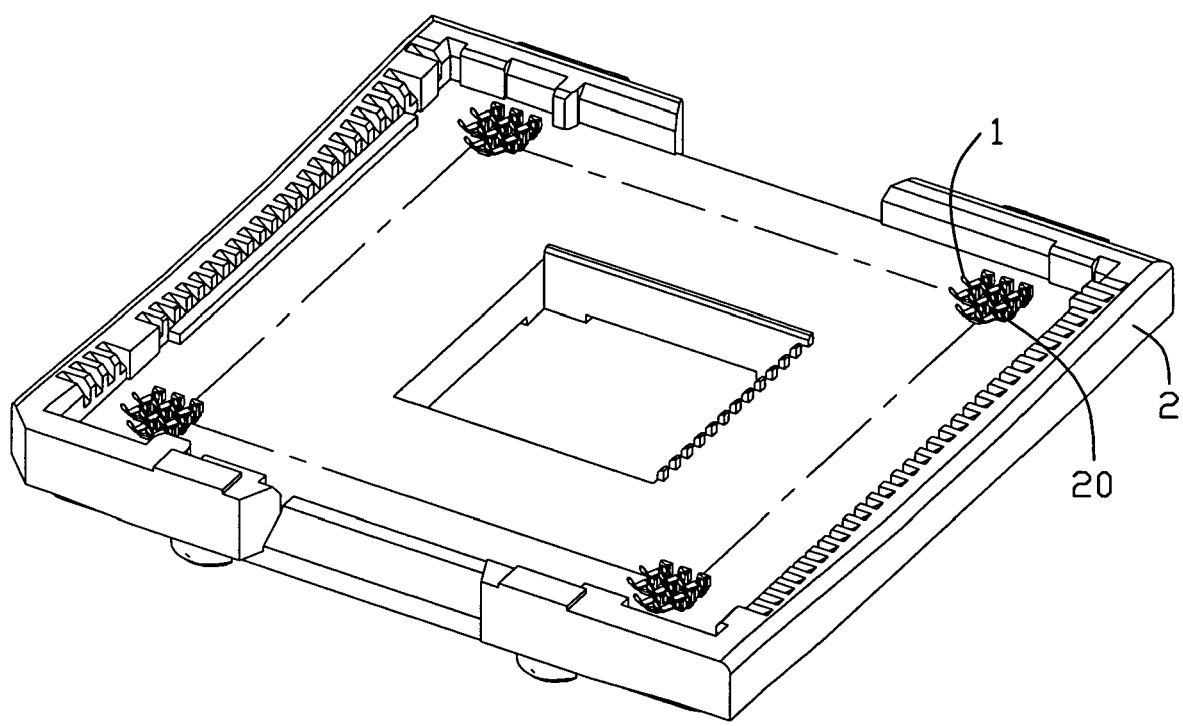
FIG. 1 is an assembly, perspective view of electrical contacts according to the present invention and an insulative housing receiving the contacts.

Referring to FIG. 1, a plurality of electrical contacts 1 are accommodated in corresponding passageways 20 of an insulative housing 2, respectively. The electrical contacts 1 are arrayed in the insulative housing in rows, so that the electrical contacts 1 in a same row extend along a predetermined lateral direction. In this embodiment, the insulative housing 2 and the electrical contacts 1 basically forms a land grid array (LGA) socket to electrically connect a CPU (not shown) and a PCB (not shown).

Figure 2:
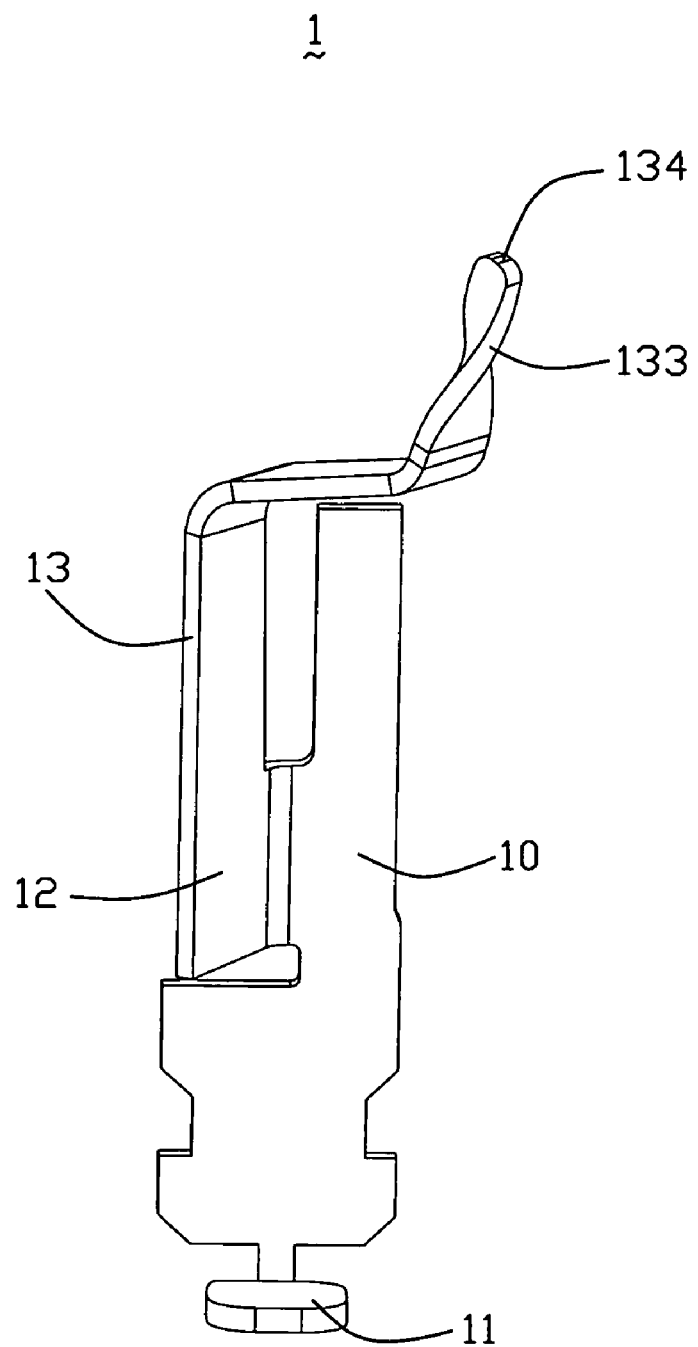
FIG. 2 is an enlarged, perspective view of the electrical contact.
Figure 3:
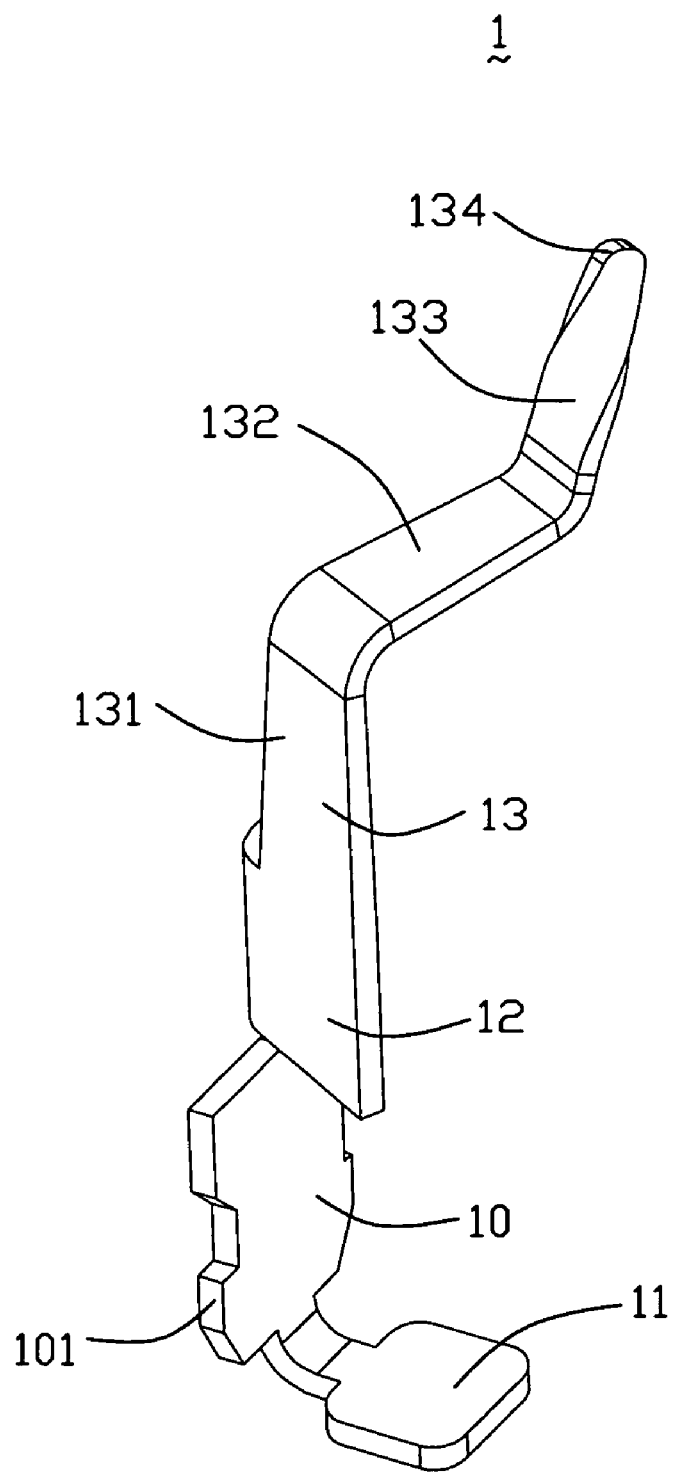
FIG. 3 is another perspective view of the electrical contact.

Referring to FIGS. 2 and 3, the electrical contact 1 is stamped from a metal piece and comprises a base portion 10 located in a vertical plane, a solder portion 11 vertically bended from a bottom edge of the base portion 10 and located in a horizontal plane, a connecting portion 12 bended at a certain angle from a part of lateral side of the base portion 10, and a spring arm 13 upwardly extending from a top edge of the connecting portion 12. The base portion 10 has a plurality of barbs 101 formed in both sides thereof for securing the electrical contact 1 in the passageway 20. The solder portion 11 is soldered to a solder ball (not shown) so as to electrically connect the electrical contact 1 with the PCB (not shown) via the solder ball (not shown). The spring arm 13 extends out of a top surface of the insulative housing 2 to electrically connect with the CPU (not shown).

The spring arm 13 comprises an medial portion 131, an inclined portion 132 and a tip portion 133 with a contacting surface 134 on a free end thereof. The medial portion 131 is directly extends upwardly from the connecting portion 12. The inclined portion 132 is bended from the media portion 131 and upwardly aslant extends from the medial portion 131. The tip portion 133 is upwardly bended from the inclined portion 132 and aslant extends.

Referring to FIGS. 3-7, The tip portion 133 is in a line-shape, and different from conventional contact (referring to FIG. 7) with curved tip portion, that the tip portion 133 is twisted 90 degree around a center line itself. The contact surface 134 is a part of a top surface of the tip portion 133 which is substantially parallel to a package pad 3 (referring to FIG. 6) of a CPU and is used to electrically contact with the package pad 3.

Figure 4:
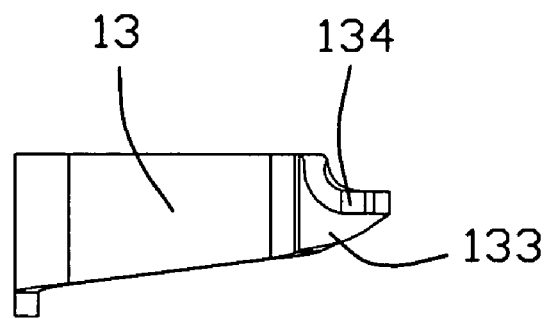
FIG. 4 is a top view of the electrical contact, only showing a spring portion of the contact in FIG. 3.
Figure 5:
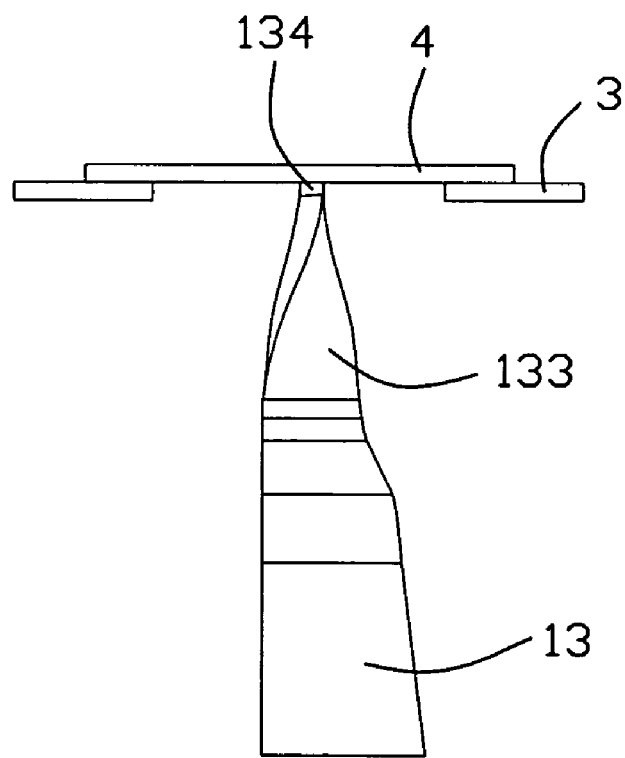
FIG. 5 is a sketch map of the electrical contact engaging with a package pad, taken from a side view.
Figure 6:
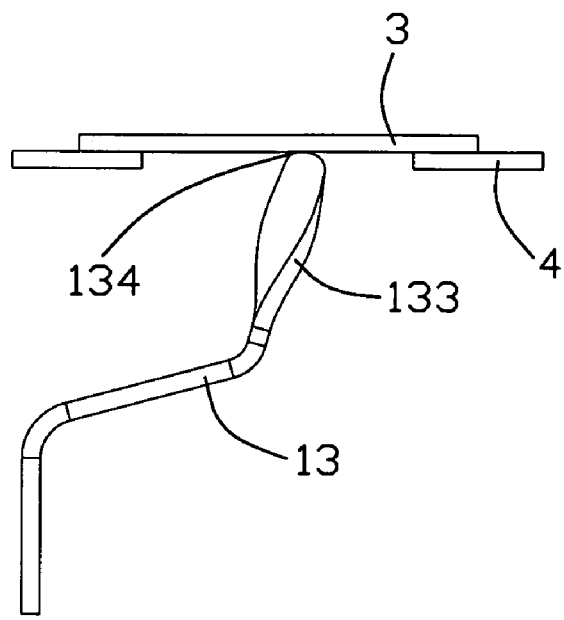
FIG. 6 is another sketch map of the electrical contact engaging with the package pad, taken from a front side.
Figure 7:
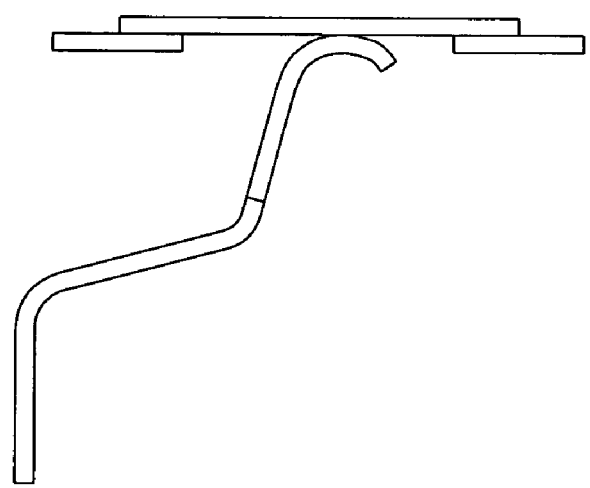
FIG. 7 is another sketch map of a conventional curved contact engaging with a package pad.

Referring to FIG. 4 and FIG. 5, a width of the contacting surface 134 of the twist tip portion 133 is reduced to the material thickness, so a distance between adjacent electrical contacts 1 become bigger that may prevent short circuit, so small pitch designs may be feasible. Continued referring to FIGS. 6-7, respectively showing the electrical contact in the present invention and the conventional contact engaging with the package pad 3, a radiuses of the twisted tip portion 133 is much smaller compared to curved tip portion of the conventional contact, so twisted contact tip portion 133 creates a bigger margin with solder resists 4 at the edge of the package pad 3, that may be of benefit to small pitch design.

Otherwise, the twist electrical contact 1 doesn't have big geometry changes compared to conventional contact with a curved tip portion. Further, the twisted tip portion 133 increases tip stiffness and can prevent the potential looping by the fabric thread from operator glove.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector comprising:
   an insulative housing having a plurality of passageways; and
   a plurality of electrical contacts received in corresponding passageways of the insulative housing, each contact formed with a base portion, a solder portion bended from the base portion and a spring portion, the spring portion having a tip portion which is twisted and protrudes out of the insulative housing, the twisted tip portion extending upwardly and forwardly from the spring portion and being formed with a contacting surface on a free end thereof, the contacting surface being a part of a front surface of the tip portion, wherein the tip portion is twisted 90 degree around a center line thereof.

2. The electrical connector of claim 1, wherein the spring portion has an upright media portion extending from the connecting portion, an incline portion aslant extending from the media portion and the tip portion bended upwardly form the incline portion.

3. The electrical connector of claim 2, further comprising a connecting portion extending from a side of the base portion and connecting the base portion and the spring portion.

4. The electrical connector of claim 3, wherein the connecting portion is bended toward the base portion in a horizontal plane to define a certain angle related to the base portion.

5. A Land Grid Array connector, adapted for connecting a central processing unit (CPU), with a printed circuit board (PCB), comprising:
   an insulative housing having a plurality of passageways; and
   a plurality of electrical contacts received in the passageways, each contact formed with a base portion, a solder portion for soldering to the PCB and a spring portion, the spring portion has an upright media portion, an incline portion aslant extending from the media portion and a tip portion bent upwardly from the incline portion, the tip portion being twisted around a center line thereof and protruding out of the insulative housing.

6. The electrical connector of claim 5, wherein the tip portion defines a front surface on a free end thereof and a part of the front surface forms a contacting surface to electrically contact the CPU.

7. The electrical connector of claim 6, further comprising a connecting portion extending from a side of the base portion and connecting the base portion and the spring portion, and the media portion of the spring portion directly extends from the connecting portion, the tip portion is twisted 90 degree around a center line thereof.

8. An electrical connector assembly comprising:
   a conductive contact defining a retention section and a curved contacting section having a contacting point at an upper tip under a condition that the curved contacting section is downward deformed when the contacting point is downwardly depressed by an electronic package;
   wherein said curved contacting section includes a twisted section proximate said contacting point,
   wherein said twisted section essentially keeps an original shape while other portions of said curved contacting section are deformed when said contacting section is downwardly depressed,
   wherein the contact point is located on an edge of the contact section.

9. The connector assembly as claimed in claim 8, wherein said curved contacting section includes an inclined portion linked below said twisted section and experiencing deformation when said curved contacting section is downwardly depressed.

* * * * *